US010628534B2

(12) United States Patent
Glockner et al.

(10) Patent No.: US 10,628,534 B2
(45) Date of Patent: Apr. 21, 2020

(54) CONSTRUCTION PRODUCT MODELLING

(71) Applicant: Hilti Aktiengesellschaft, Schaan (LI)

(72) Inventors: Oliver Glockner, Feldkirch (AT);
Matthias Ebneter, Werdenberg (CH);
Thomas Schmidt, Tontnas (CH);
Daniel Carcedo Blanco, Sevelen (CH);
David Crawford, Prosper, TX (US);
René Gries, Lindau (DE)

(73) Assignee: Hilti Aktiengesellschaft, Schaan (LI)

( * ) Notice: Subject to any disclaimer, the term of this patent is extended or adjusted under 35 U.S.C. 154(b) by 586 days.

(21) Appl. No.: 14/844,948

(22) Filed: Sep. 3, 2015

(65) Prior Publication Data

US 2017/0068752 A1    Mar. 9, 2017

(51) Int. Cl.
*G06G 7/48* (2006.01)
*G06F 17/50* (2006.01)

(52) U.S. Cl.
CPC .................. *G06F 17/5004* (2013.01)

(58) Field of Classification Search
None
See application file for complete search history.

(56) References Cited

U.S. PATENT DOCUMENTS

| 9,782,936 | B2 * | 10/2017 | Glunz | B33Y 50/00 |
| 2004/0030718 | A1 * | 2/2004 | Boros | G06Q 30/02 |
| 2004/0181551 | A1 * | 9/2004 | Goodman | G06Q 10/00 |
| 2007/0214152 | A1 * | 9/2007 | Goodman | G06Q 10/00 |
| 2008/0313993 | A1 * | 12/2008 | Reen | E04G 23/0203 |
| | | | | 52/718.01 |

(Continued)

OTHER PUBLICATIONS

University of California, Davis Materiel Management/Purchasing Services. 202 Cousteau Place, Suite 205, Davis, California 95618-7761. Request for Proposal. Date E-Mailed/Posted: Oct. 29, 2009.*

(Continued)

*Primary Examiner* — Rehana Perveen
*Assistant Examiner* — Nithya J. Moll
(74) *Attorney, Agent, or Firm* — Grüneberg and Myers PLLC

(57) ABSTRACT

A method for updating a computer aided design model of a building is disclosed. The model of the building may include at least one barrier and at least one penetrating item. A barrier may have fire resistance properties and include a passage to accommodate passage of a penetrating item, with firestop product information to maintain the fire resistance properties of the barrier. The method may be carried out by defining a universe of one or more barriers that have fire resistance properties; analyzing a computer aided design model of a building to identify an intersection of a penetrating item and a barrier that is within the defined universe; analyzing the computer aided design model of the building for fire resistance properties corresponding to the barrier. The method may be further carried out by using the fire resistance properties corresponding to the barrier to identify a firestop product to maintain the fire resistance properties of the barrier; and updating the computer aided design model of the building to include information of the firestop product, a drawing of the firestop product, or both.

15 Claims, 2 Drawing Sheets

(56) References Cited

U.S. PATENT DOCUMENTS

2009/0126989 A1* 5/2009 Ford .................. A62C 3/16
174/491
2012/0021550 A1   8/2012 Ciuti et al.
2012/0215500 A1* 8/2012 Ciuti .............. G06F 17/5004
703/1
2015/0135631 A1* 5/2015 Foerg ............... E04B 2/7411
52/717.04

OTHER PUBLICATIONS

Hilti Firestop Systems. Jan. 27, 2015.*
Nassar, K., Walid Thabet, and Yvan Beliveau. "A procedure for multi-criteria selection of building assemblies." Automation in Construction 12.5 (2003): 543-560.*
Zicherman, Joseph B., et al. "PC-Based product-selection systems to enhance fire safety in construction." Fire and materials 16.2 (1992): 53-60.*

* cited by examiner

CONSTRUCTION PRODUCT MODELLING

BACKGROUND OF THE INVENTION

The present embodiment relates generally to processing digital data for construction products, and more specifically, to a method of determining a safety certificate and corresponding suitable products from data of planned structures.

SUMMARY

In one aspect, a method may be used for updating a computer aided design model of a building. The model of the building may include at least one barrier and at least one penetrating item, such as pipes, conduits, tubing, cable bundles, cable trays, electrical busways, mechanical support members, and ducts. A barrier, such as walls, slabs or floors, may have fire resistance properties and include a passage to accommodate passage of a penetrating item. The computer aided design model of the building may be updated with firestop product information to maintain the fire resistance properties of the barrier. The method may be carried out by defining a universe of one or more barriers that have fire resistance properties; analyzing a computer aided design model of a building to identify an intersection of a penetrating item and a barrier that is within the defined universe; analyzing the computer aided design model of the building for fire resistance properties corresponding to the barrier; using the fire resistance properties corresponding to the barrier to identify a firestop product to maintain the fire resistance properties of the barrier; and updating the computer aided design model of the building to include information of the firestop product, a 3D CAD object of a firestop product, or both.

In another aspect, a method may be used for updating a computer aided design model of a building. The model of the building may include at least one barrier with fire resistance properties and at least one penetrating item with attributes. A barrier may include a passage to accommodate passage of a penetrating item, with firestop product information to maintain the fire resistance properties of the barrier. The method may be carried out by defining a universe of one or more barriers that have fire resistance properties and defining a universe of one or more penetrating items that have attributes; analyzing a computer aided design model of a building to identify an intersection of a penetrating item and a barrier that is within the defined universe; and analyzing the computer aided design model of the building for the fire resistance properties corresponding to the barrier and the attributes corresponding to the penetrating item; using the fire resistance properties corresponding to the barrier and the attributes corresponding to the penetrating item to identify a firestop product to maintain the fire resistance properties of the barrier; updating the computer aided design model of the building to include information of the firestop product, a drawing of the firestop product, or both.

These and other features, aspects and advantages of the present invention will become better understood with reference to the following drawings, description and claims.

DETAILED DESCRIPTION OF EMBODIMENTS

Figure 1:
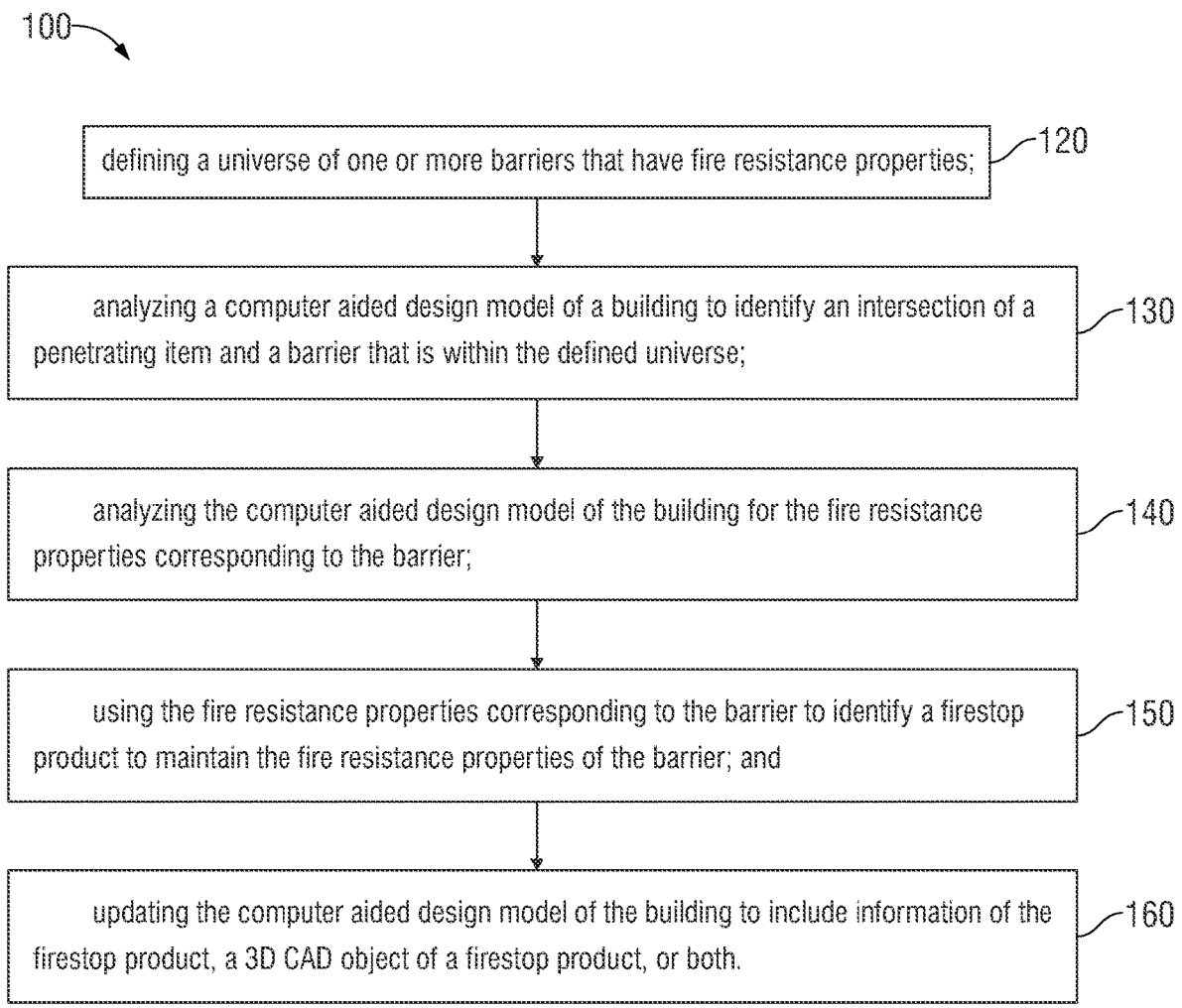
FIG. 1 is a flow chart illustrating a method for updating a computer aided design model of a building according to an embodiment.

The following detailed description is of the best currently contemplated modes of carrying out exemplary embodiments. The description is not to be taken in a limiting sense, but is made merely for the purpose of illustrating the general principles, since the scope of the embodiments is best defined by the appended claims.

Various inventive features are described below that can each be used independently of one another or in combination with other features.

Broadly, the exemplary embodiments provide methods and systems for determining a safety certification for creating or changing penetration of a structure. The embodiments also provide methods and systems that facilitate adequate connection between the safety certification and a relevant suitable product satisfying the safety certification.

Exemplary embodiments may take the form of an entire hardware embodiment, an entire software embodiment (including firmware, resident software, micro-code, etc.) or an embodiment combining software and hardware aspects that may all generally be referred to herein as a "circuit," "module" or "system." Furthermore, exemplary embodiments may take the form of a computer program product embodied in any tangible medium of expression having computer-usable program code embodied in the medium.

Any combination of one or more computer usable or computer readable medium(s) may be utilized. The computer-usable or computer-readable medium may be, for example, but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction performance system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, and RF.

Computer program code for carrying out operations of embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments are described below with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

As shown in FIG. 1, a method 100 may be used for updating a computer aided design model of a building. The model of the building may include at least one barrier and at least one penetrating item. A barrier may have fire resistance properties and may include a passage to accommodate passage of a penetrating item, with firestop product information to maintain the fire resistance properties of the barrier. The method may be carried out by defining a universe of one or more barriers that have fire resistance properties at step 120. A barrier, such as a fire barrier, may be placed throughout the building. Such fire barrier may be walls or floors rated for 1, 2, 3 or 4 hours, during which no fire, smoke and fumes are to pass across in a fire. The step 120 of defining the universe of one or more barriers includes defining a set of marginal conditions of the barrier. The set of marginal conditions may include, for example, at least one of a barrier type, a wall material, and a fire-resistant rating. The computer aided design model of the building may be a commercial computer aided design program (CAD). A user can choose the barrier by a click of an icon or an object at the computer aided design model.

The fire resistance properties, such as fire-resistant ratings (or fire ratings), may be based on tests in a standard furnace according to an approved method by building officials. In the United States, the standards are based on American Society of Testing Materials (ASTM) Standard E814-02, equivalent to one in Canada and to International Organization for Standardization (ISO 834), and similar to DIN-4102 in Germany, JISA-1304 in Japan, SISO 24820 in Sweden, etc.

Fire resistance properties, herein used, may refer to the property of materials or their assemblies that prevent or retard a passage of excessive heat, hot gases or flames under conditions of use.

Fire-resistance rating, herein used, may refer to a period of time for a building element, component or assembly to maintain an ability to confine a fire, continue to perform a given structural function, or both, as determined by tests.

Fire protection rating, herein used, may refer to a period of time for an opening protective assembly to maintain the ability to confine a fire as determined by tests.

The method 100 may be further carried out by analyzing a computer aided design model of a building to identify an intersection of a penetrating item and a barrier that is within the defined universe in step 130. The step 130 of analyzing a computer aided design model of a building to identify an intersection of the penetrating item and the barrier may include identifying the X, Y, and Z coordinates of the intersection of the penetrating item and the barrier. The information of the firestop product may include the X, Y, Z coordinates. The penetrating item may be an electrical conduit, a plumbing conduit, or a mechanical conduit.

Once a fire barrier is penetrated by various penetrants like cables, cable bundles, cable trays, conduits (cables in pipes), mechanical conduits, plumbing conduits, pipes, tubing, ducts, cable trays, (electrical) busways, mechanical support members, etc., then the fire barrier is compromised. The created openings ("through penetrations") are required to be sealed with special firestop materials. An additional property for which the materials are tested and approved is, in general, the fire protection property, such as temperature-time rating, so called T ratings in U.S. and Canada, and resistance R rating under ISO, and firestop rating, so called F ratings in U.S. The T rating gives time in hours for which temperature on the off-fire side of a fire barrier (penetration firestop system, including the penetrating item) is less than 325° F. (163° C.) over ambient temperature, i.e., below the ignition temperature of most common materials. The F rating gives the time that a through-penetration firestop system limits the spread of fire through the penetration.

For metallic penetrants, cables and small plastic pipes, the firestops may be inserted around penetrants inside the fire barrier. The seals may be either insulating, or intumescent (expanding in heat), heat absorbing, or have combined properties. Heat absorbing involves energy absorption in: (1) phase changes (e.g., sublimation), (2) hydration, breaking bonds between mineral molecule and water (e.g., in $CaSO_4.2H_2O$), or in (3) chemical reactions.

For plastic pipes, the sealing material may consist of intumescent fire retardant wraps around plastic pipes, surrounded by a metallic collar in order to permit only axial expansion toward the center of the plastic pipe, which melts and burns in a fire.

The method 100 may be further carried out by analyzing the computer aided design model of the building for the fire resistance properties corresponding to the barrier in step 140. The step 140 of analyzing the computer aided design model of a building to identify an intersection of a penetrating item and a barrier that is within the defined universe may comprise identifying attributes of the barrier and the penetrating item at the intersection. The step of using the fire resistance properties corresponding to the barrier to identify the firestop product may include using the attributes of the barrier and the penetrating item at the intersection to identify the firestop product, the certificates, or both.

The barrier may include in general a wall, a slab, or a floor, and in particular a concrete floor, a dry wall, a hardwood floor, or a carpet, for example. The barrier may reside in a structure, such as a building. The fire resistance properties, such as a fire-resistance rating may mean the duration for which a passive fire protection system may withstand a standard fire resistance test. This can be quantified simply as a measure of time, or it may entail a host of other criteria, involving other evidence of functionality or fitness for purpose. The attributes may include the physical and geometric properties of the barrier and the penetrating item.

The method 100 may be further carried out by using the fire resistance properties corresponding to the barrier to identify a firestop product to maintain the fire resistance properties of the barrier in step 150. The step 150 of using the fire resistance properties corresponding to the barrier to identify a firestop product may comprise steps of selecting a technical approval or listings, and identifying the firestop product based on the selected technical approval or certificate. The technical approval or listings may include Association Francaise de Normalisation (AFNOR), Australian Standard (AS), American Society for Testing Materials (ASTM), British Standard (BS), Underwriters' Laboratories of Canada (CAN/ULC), Deutsches Institute fuer Normung (DIN), Deusches Institut fuer Normung European standard (DIN/EN), European Standard (EN), EN ISO (European standard International Standard Organization (EN ISO), USSRV State Committee for Standards (GOST), J-STD, Underwriters' Laboratories (UL), European Technical Assessment/Approval (ETA), and National German Technical Approval issued by the DIBt-Deutsches Deutsches Institut für Bautechnik: allgemeine bauaufsichtliche Zulassung (abZ), for example.

The method 100 may be further carried out by updating the computer aided design model of the building to include information of the firestop product, a drawing of the firestop product, or both in a step 160. The computer aided design model of the building may include plugins for common CAD software for architects, structural engineers, designers and contractors. The CAD software allows users to design a building, a structure, and its components in three dimensions and access building information from the building model's database. The plugin may be a firestop plugin to allow users to utilize the functionality of the present invention. Alternatively, the CAD software may include the functionality of the present invention.

The firestop plugin may allow the user to enter and edit firestop related attributes to the building model's database objects, such as walls, slabs, and pipes. The firestop plugin may have a functionality to import information from a database storing data corresponding to firestop products, such as firestop blocks and firestop cast in devices, into the building information model automatically.

Figure 2:
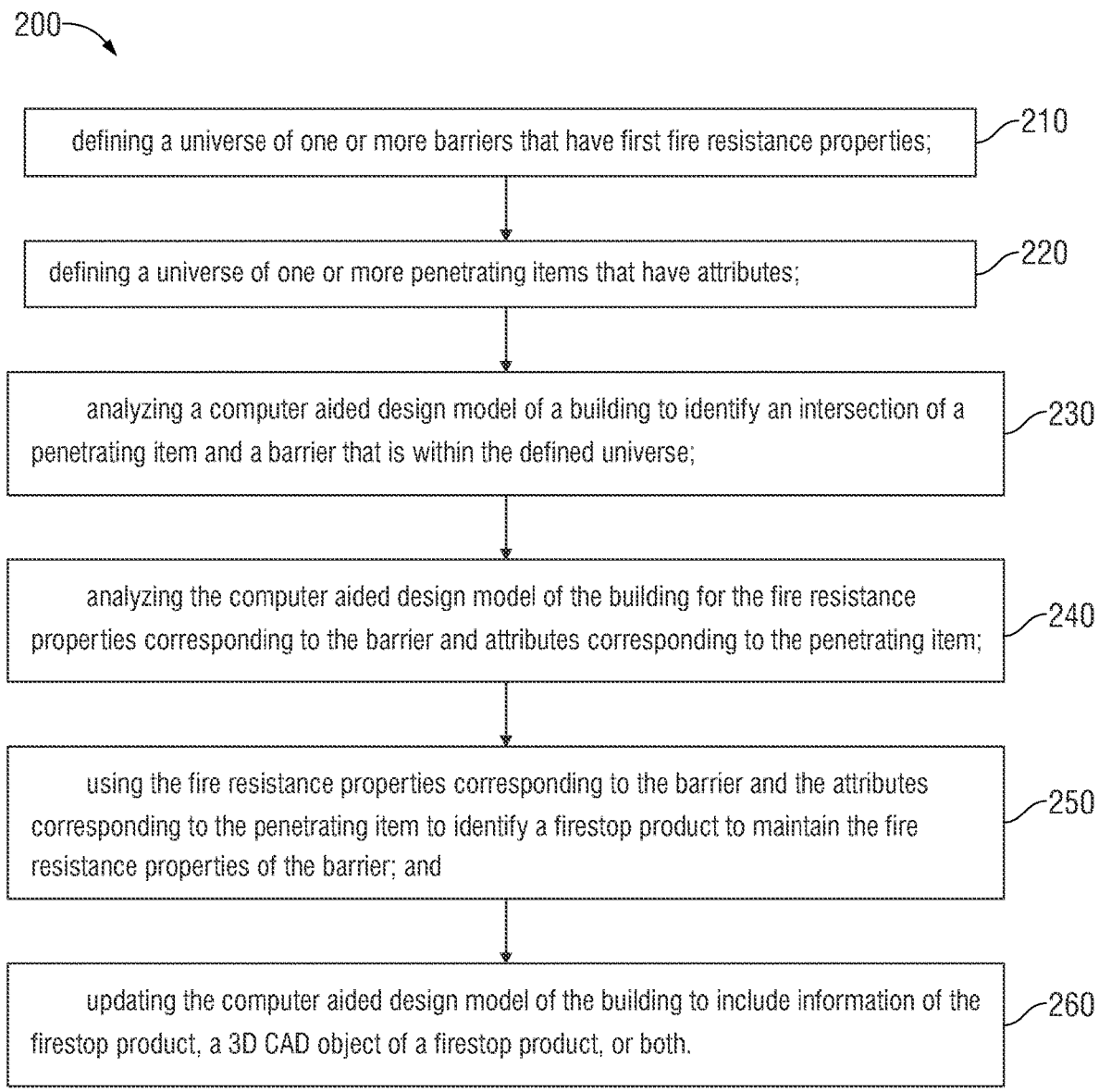
FIG. 2 is a flow chart illustrating a method for updating a computer aided design model of a building according to another embodiment.

In another embodiment, as shown in FIG. 2, a method 200 may be used for updating a computer aided design model of a building. The model of the building may include at least one barrier with fire resistance properties and at least one penetrating item with attributes. The barriers may include a passage to accommodate passage of a penetrating item. The computer aided design model of the building may be updated with firestop product information to maintain the fire resistance properties of the barrier. The method 200 may be carried out by defining a universe of one or more barriers that have fire resistance properties in step 210.

The step 210 of defining the universe of one or more barriers includes defining a set of marginal conditions of the barrier. The set of marginal conditions may include, for example, at least one of a barrier type, a wall material, and a fire-resistant rating.

The method 200 may be carried out by defining a universe of one or more penetrating items that have attributes in step 220.

The data, such as the fire resistance properties of the barriers and the attributes of the penetrating items, may be entered either manually by users or may be automatically determined by a further software module, which may be part of the computer aided design (CAD) software or a project review software. Examples of CAD software that may be used include, for example Autodesk Autocad MEP, Autodesk Autocad Fabricator, or Autodesk Revit. An example of project review software is or Autodesk Navisworks. Navisworks may allow users to open and combine three-dimensional models, navigate around them in real-time and review the model using a set of tools including comments, redlining, measurements and clash detection. The firestop plugin, described above in connection with FIG. 1, may use the clash detection functionality to identify intersections between firestop relevant objects like fire rated walls/slabs and pipes/ducts. This list of clashes, including the X, Y, and Z coordinates may define a list of penetrations to be used by the CAD software and/or firestop plugin.

The method 200 may be further carried out by analyzing a computer aided design model of a building to identify an intersection of a penetrating item and a barrier that is within the defined universe in step 230. The step 230 of analyzing a computer aided design model of a building to identify an intersection of the penetrating item and the barrier may include identifying the X, Y, and Z coordinates of the intersection of the penetrating item and the barrier. The information of the firestop product may include the X, Y, Z coordinates. The penetrating item may be an electrical conduit, a plumbing conduit, or a mechanical conduit. The step 230 of analyzing the computer aided design model of a building to identify an intersection of a penetrating item and a barrier that is within the defined universe may comprise identifying attributes of the barrier and the penetrating item at the intersection.

The method 200 may be further carried out by analyzing the computer aided design model of the building for the fire resistance properties corresponding to the barrier and the attributes corresponding to the penetrating item in step 240. The step of using the fire resistance properties corresponding to the barrier to identify the firestop product may include using the attributes of the barrier and the penetrating item at the intersection to identify the firestop product, the certificates, or both.

The method 200 may be further carried out by using the fire resistance properties corresponding to the barrier and the attributes corresponding to the penetrating item to identify a firestop product to maintain the fire resistance properties of the barrier in step 250. The step 250 of using the fire resistance properties corresponding to the barrier and the attributes corresponding to the penetrating item to identify a firestop product may comprise steps of selecting a technical approval or listings, and identifying the firestop product based on the selected technical approval or certificate. The technical approval or listings may include Association Francaise de Normalisation (AFNOR), Australian Standard (AS), American Society for Testing Materials (ASTM), British Standard (BS), Underwriters' Laboratories of Canada (CAN/ULC), Deutsches Institute fuer Normung (DIN), Deusches Institut fuer Normung European standard (DIN/EN), European Standard (EN), EN ISO (European standard International Standard Organization (EN ISO), USSRV State Committee for Standards (GOST), J-STD, Underwriters' Laboratories (UL), European Technical Assessment/Approval (ETA), and National German Technical Approval issued by the DIBt-Deutsches Deutsches Institut für Bautechnik: allgemeine bauaufsichtliche Zulassung (abZ), for example.

The method 200 may be further carried out by updating the computer aided design model of the building to include information of the firestop product, a drawing of the firestop product, or both in a step 260. The computer aided design model of the building may include plugins for common CAD software for architects, structural engineers, designers and contractors. The CAD software allows users to design a building, a structure, and its components in three dimensions and access building information from the building model's database. The plugin may be a firestop plugin to allow users to utilize the functionality of the present invention. Alternatively, the CAD software may include the functionality of the present invention.

The firestop plugin may allow the user to enter and edit firestop related attributes to the building model's database objects, such as walls, slabs, and pipes. The firestop plugins may have a functionality to import information from a database storing data corresponding to firestop products, such as firestop blocks and firestop cast in devices, into the building information model automatically.

The firestop plugin may be standalone software with which the user can determine the certifications. One example of a firestop plugin is the Firestop Manager available from Hilti Corporation. The Firestop Manager is available as a desktop computer program or an online program available on the webpage of the Hilti Corporation. However, as apparent from the description herein, a client device, a server or other machine may include other features or only some of the features of the method 200. The firestop plugin may enable users to define and manage firestop penetrations.

Users may select a barrier type, such as a concrete wall or floor and the penetrant such as pipe or duct. Based on the additional information as dimensions, material and fire rating, T rating or L rating, the firestop plugin may compute a suitable safety certification and a corresponding product. The corresponding product may be used for penetration of the structure.

One or more barrier penetrations in the computer aided design model may be updated, as desired. A number of penetrations may be grouped by subcontractors or trade, such as mechanical, electrical, piping, etc. Penetrations may be grouped also by a building level or direction of barrier type, such as vertical or horizontal barrier. The method 200 may further include the step of generating a submittal document, such as a Word document or a pdf file. The submittal may include all underwriter laboratory system and corresponding product, such as Hilti firestop product description of the current selected penetration.

The firestop plugin may additionally include functionality to allow a user to operate the computer software to analyze the computer aided design model of the building to identify the penetrating item and the barrier by clicking an icon of the penetrating item and the barrier.

The method 200 may be further carried out by using the fire resistance properties to identify a certification system corresponding to the fire resistance properties in step 260. For example, the fire resistance properties of barriers (such as concrete floor, concrete/masonry wall, concrete slab) may be 2 hours. An appropriate UL firestop system corresponding to the fire resistance properties of concrete floor, concrete/masonry wall, or concrete slab, may be C-AJ-0055. The method 200 may further be carried out by using the certification system to identify a firestop product with fire protection properties sufficient to maintain the fire resistance properties of the barrier. For example, Hilti's firestop product CFS-BL corresponds to the UL firestop system C-AJ-0055.

The flowchart and block diagrams in the Figures illustrate the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be performed substantially concurrently, or the blocks may sometimes be performed in the reverse order, depending upon the functionality involved. One block shown may sometimes be omitted It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be understood, of course, that the foregoing description relates to exemplary embodiments of the invention and that modifications may be made without departing from the spirit and scope of the invention as set forth in the following claims.

The invention claimed is:

1. A method for updating a computer aided design model of a building, wherein the model of the building includes at least one barrier and at least one penetrating item and where a barrier has fire resistance properties and includes a passage to accommodate passage of a penetrating item, comprising:
    defining a universe of one or more barriers that have fire resistance properties;
    analyzing a computer aided design model of a building to identify an intersection of a penetrating item and a barrier that is within the defined universe;
    analyzing the computer aided design model of the building for the fire resistance properties corresponding to the barrier;
    identifying a firestop product to maintain the fire resistance properties of the barrier, the firestop product identified by a function or plug-in of the computer aided design model based on the fire resistance properties corresponding to the barrier; and
    updating the computer aided design model of the building to include information of the firestop product, a 3D CAD object of the firestop product, or both, wherein the function or plug-in is configured to allow a user to enter and edit firestop related attributes of database objects corresponding to the computer aided design model of the building.

2. The method of claim 1, wherein the step of analyzing a computer aided design model of a building to identify an intersection of the penetrating item and the barrier includes identifying the X, Y, and Z coordinates of the intersection of the penetrating item and the barrier; and wherein the information of the firestop product includes the X, Y, Z coordinates.

3. The method of claim 1, wherein the penetrating item is a cable, a cable bundle, a cable tray, a conduit (cables in pipes), a mechanical conduit, a plumbing conduit, a pipe, a tubing, a duct, an electrical busway, or a mechanical support member.

4. The method of claim 1, wherein the step of using the fire resistance properties corresponding to the barrier to identify a firestop product comprises:
selecting a technical approval or listings, and
identifying the firestop product based on the selected technical approval or certificate.

5. The method of claim 1, wherein the step of analyzing the computer aided design model of a building to identify an intersection of a penetrating item and a barrier that is within the defined universe comprises identifying attributes of the barrier and the penetrating item at the intersection and
wherein the step of using the fire resistance properties corresponding to the barrier to identify the firestop product includes using the attributes of the barrier and the penetrating item at the intersection to identify the firestop product, the certificates, or both.

6. The method of claim 5, wherein the attributes include the physical and geometric properties of the barrier and the penetrating item.

7. The method of claim 1, wherein defining a universe comprises defining a set of marginal conditions.

8. The method of claim 7, wherein said marginal conditions are at least two conditions selected from the group consisting of barrier type, wall material and fire-resistant rating.

9. The method of claim 1, further comprising:
displaying a graphical representation of the penetrating item and the barrier based on the computer aided design model of the building, and
identifying the penetrating item and the barrier using the function or plug-in,
wherein the penetrating item and barrier are identified based on a received input and wherein the input is based on a click of an icon of the penetrating item or barrier on a display screen.

10. A method for updating a computer aided design model of a building, wherein the model of the building includes at least one barrier with fire resistance properties and at least one penetrating item with attributes and where a barrier includes a passage to accommodate passage of a penetrating item, comprising:
defining a universe of one or more barriers that have fire resistance properties;
defining a universe of one or more penetrating items that have attributes;
analyzing a computer aided design model of a building to identify an intersection of a penetrating item and a barrier that is within the defined universe;
analyzing the computer aided design model of the building for the fire resistance properties corresponding to the barrier and the attributes corresponding to the penetrating item;
identifying a firestop product to maintain the fire resistance properties of the barrier, the firestop product identified by a function or plug-in of the computer aided design model based on the fire resistance properties corresponding to the barrier and the attributes corresponding to the penetrating item; and
updating the computer aided design model of the building to include information of the firestop product, a 3D CAD object of the firestop product, or both, wherein the function or plug-in is configured to allow a user to enter and edit firestop related attributes of database objects corresponding to the computer aided design model of the building.

11. The method of claim 10, wherein the step of analyzing a computer aided design model of a building to identify an intersection of the penetrating item and the barrier includes identifying the X, Y, and Z coordinates of the intersection of the penetrating item and the barrier; and wherein the information of the firestop product includes the X, Y, Z coordinates.

12. The method of claim 10, wherein the penetrating item is a cable, a cable bundle, a cable tray, a conduit (cables in pipes), a mechanical conduit, a plumbing conduit, a pipe, a tubing, a duct, an electrical busway, or a mechanical support member.

13. The method of claim 10, wherein the step of using the fire resistance properties corresponding to the barrier to identify a firestop product comprises:
selecting a technical approval or listings, and
identifying the firestop product based on the selected technical approval or certificate.

14. The method of claim 10, wherein the step of analyzing the computer aided design model of a building to identify an intersection of a penetrating item and a barrier that is within the defined universe comprises identifying attributes of the barrier and the penetrating item at the intersection and
wherein the step of using the fire resistance properties corresponding to the barrier to identify the firestop product includes using the attributes of the barrier and the penetrating item at the intersection to identify the firestop product, the certificates, or both.

15. The method of claim 14, wherein the attributes include the physical and geometric properties of the barrier and the penetrating item.

* * * * *